United States Patent [19]
Wecker et al.

[11] Patent Number: 5,498,298
[45] Date of Patent: Mar. 12, 1996

[54] METHOD FOR PREPARING A STRUCTURE HAVING ENHANCED MAGNETORESISTANCE, AND USE OF THE STRUCTURE

[75] Inventors: Joachim Wecker; Rittmar Von Helmolt, both of Erlangen, Germany

[73] Assignee: Siemens Aktiengesellschaft, München, Germany

[21] Appl. No.: 430,118

[22] Filed: Apr. 27, 1995

Related U.S. Application Data

[63] Continuation of Ser. No. 129,218, Sep. 29, 1993, abandoned.

[30] Foreign Application Priority Data

Sep. 29, 1992 [DE] Germany ............ 42 32 682.6
Apr. 7, 1993 [DE] Germany ............ 42 11 516.0

[51] Int. Cl.$^6$ .................................. H01F 41/02
[52] U.S. Cl. .................. 148/105; 75/348; 148/121
[58] Field of Search .................. 75/338, 348, 349; 148/104, 105, 121

[56] References Cited

U.S. PATENT DOCUMENTS

| | | | |
|---|---|---|---|
| 4,723,994 | 2/1988 | Oushinsky et al. | 148/105 |
| 4,854,979 | 8/1989 | Wecker | 148/104 |
| 5,100,485 | 3/1992 | Yamashita et al. | 148/105 |
| 5,288,339 | 2/1994 | Schnitzke et al. | 148/104 |

FOREIGN PATENT DOCUMENTS 0498668 8/1992 European Pat. Off. .

OTHER PUBLICATIONS

Appl. Phys. Lett., vol. 58, No. 23, 1991, pp. 2710–2712, S. S. P. Parkin: *Giant magnetoresistance in antiferromagnetic Co/Cu multilayers*.
Sensors, vol. 5, 1989, pp. 341–380, W. Göpel et al.: *Magneto–Resistive Sensors*.
Phys. Rev. Lett., vol. 64, No. 19, 7 May 1990, pp. 2304–2307, S. S. P. Parkin et al.: *Oscillation in Exchange Coupling and Magnetoresistance in Metallic Superlattice Structures: Co/Ru, Co/Cr, and Fe/Cr*.
Phys. Rev. Lett., vol. 61, No. 21, 21 Nov. 1988, pp. 2472–2475, M. N. Baibich et al.: *Giant Magnetoresistance of (001) Fe/(001)Cr Magnetic Superlattices*.
Phys. Rev. Lett., vol. 68, No. 25, 22 Jun. 1992, pp. 3745–3748, A. E. Berkowitz et al.: *Giant Matnetoresistance in Heterogeneous Cu–Co Alloys*.
Phys. Rev. Lett., vol. 68, No. 25, 22 Jun. 1992, pp. 3749–3752, J. Q. Xiao et al.: *Giant Matnetoresistance in Nonmultilayer Magnetic System*.
Z. Metalkde, vol. 69, No. 4, 1978, pp. 212–220, Hans Warlimont: *Aufbau und Eigenschaften metallischer Gläser*.
Phys. Bl., vol. 34, 1978, pp. 573–584, P. Haasen: *Metallische Gläser*.
35th Ann. Conf. Magn. Magn. Mat., 1990, E. D. Dahlberg et al., contribution BC07.
Chemical Abstracts, vol. 108, No. 16, Apr. 18, 1988, p. 686, Abstract No. 141 776t, Chen et al.: *Magneto–resistance and magnetic breakdown phenomenon in amorphous magnetic alloys*.
Chemical Abstracts, vol. 116, No. 16, Apr. 20, 1992, pp. 297–298, Abstract No. 156 641j, Shepelevich, V. G.: *Structure and electric properties of rapidly quenched antimony–selenium alloy foils*.

Primary Examiner—George Wyszomierski
Attorney, Agent, or Firm—Kenyon & Kenyon

[57] ABSTRACT

A method for preparing a structure having enhanced magneto-resistance, and use of the structure, in which it is possible to prepare a structure having enhanced magnetoresistance on the basis of the system of materials Cu—Co, especially for a magnetoresistive sensor. An intermediate of the structure is formed initially from an alloy having Cu mixed crystals supersaturated with Co by means of a rapid-solidification technique and this intermediate is subsequently converted by means of a predefined heat treatment into an end product of the desired structure having precipitations of or including Co in a Cu matrix.

20 Claims, 4 Drawing Sheets

METHOD FOR PREPARING A STRUCTURE HAVING ENHANCED MAGNETORESISTANCE, AND USE OF THE STRUCTURE

This is a continuation of U.S. patent application Ser. No. 08/129,218 filed on Sep. 29, 1993, now abandoned.

BACKGROUND OF THE INVENTION

The present invention relates to a process for preparing a structure having enhanced magnetoresistance on the basis of the system of materials Cu—Co. A process of this type follows from "Appl. Phys. Lett.", Vol. 58, No. 23, Jun. 10, 1991, pp. 2710 to 2712. The present invention further relates to the use of such a structure and to a magnetoresistive sensor prepared by the process.

The general structure and the mode of operation of magnetoresistive sensors having thin films made of ferromagnetic transition metals are explained in more detail, for example, in the publication "Sensors", Vol. 5, 1989, pp. 341 to 380. However, the largely magnetostriction-free layers disclosed there, which comprise, e.g., a special NiFe alloy "Permalloy") or a special NiCo alloy, only exhibit a relatively small magnetoresistive effect $M_r$ of approximately 2 to 3%. The variable $M_r$ in this context is in general defined as follows: $M_r=[R(O)-R(B)]/R(O)$, $R(B)$ being the ohmic resistance of the structure in an external magnetic field having the induction B, and R(O) being the corresponding resistance in the absence of a magnetic field.

Any enhancement of this magnetoresistive effect would be thus be of interest in order to be able to produce sensors having an improved signal-to-noise ratio and to extend the field of application of these sensors. An enhanced magnetoresistive effect has been demonstrated in a number of multilayer systems such as Co/Cu, Co/Cr and Fe/Cr (e.g., see "Phys. Rev. Lett.", Vol. 64, No. 19, May 7, 1990, pp. 2304 to 2307). This is based on the fact that the non-magnetic interlayer gives rise to exchange coupling (exchange interaction) which depends on the thickness of the interlayer (cf. contribution B.C.07 to the "35th Annual Conference on Magnetism and Magnetic Materials" (MMM Conference), San Diego, USA, Oct. 29 to Nov. 1, 1990). The exchange coupling is responsible for the magnetic behavior (ferromagnetic-antiferromagnetic) of the multilayer system.

Accordingly, multilayer systems having different directions of polarization of the superimposed ferromagnetic individual layers, which are separated by non-magnetic layers, may produce an enhanced magnetoresistive effect. This effect, which for layered Cu—Co thin-film structures at room temperature may amount to up to $M_r=40\%$ (cf. the literature reference, mentioned in the introduction, from "Appl. Phys. Lett." 58), is therefore also known as the "Giant Magnetoresistive Effect" ("Phys. Rev. Lett.", Vol. 61, No. 21, Nov. 21, 1988, pp. 2472 to 2475).

The limitation to multilayer systems and the fact that the effect is strongly dependent on the very low thickness of the magnetic and non-magnetic layers, respectively, in the nanometer range makes great demands on process technology, however, and restricts the field of application to thin-film structures. Moreover, suitable substrates are required as carriers for the multilayer system.

In addition, experiments have been carried out according to which a magnetoresistive effect can also occur in granular systems (cf. "Phys. Rev. Lett.", Vol. 68, No. 25, 1992, pp. 3745 to 3752). In this known process, CuCo alloy layers are produced by simultaneous sputtering of the elements, a subsequent heat treatment being employed to generate nanocrystalline (magnetic) Co precipitations in a (non-magnetic) Cu matrix. The magnetoresistive effect $M_r$ which can be measured in these thin films is, however, no greater than at most 7% at room temperature.

SUMMARY OF THE INVENTION

The present invention refines the process having the features mentioned above in such a manner that it can be used to obtain in a relatively simple manner a structure which, in particular, is layer- or strip-shaped and has an enhanced magnetoresistive effect of, in particular, over 8%, this property being required to be reliably reproducible.

This is achieved according to the present invention by means of the measures specified below. The structure which can be obtained thereby also includes a single-layer embodiment having a single layer.

The process according to an embodiment of the present invention is thus essentially based on the preparation of a supersaturated Cu mixed crystal as the first step, from which, by means of the predefined heat treatment, a fine dispersion of Co precipitations or Co-containing precipitations in a Cu matrix are formed. The equilibrium solubility of Co in Cu is at most 5.6 atom % at 1110° C. Higher supersaturation, as is possible in the process according to the present invention, has hitherto only been achieved with processes which remain limited to low process temperatures such as, for example, with mechanical alloying or sputtering or evaporation, i.e. condensation from the gas phase. The reason for this is that Cu and Co form a system having positive heat of mixing, i.e. have the tendency to segregate even in the melt.

The process according to the present invention is based on the insight that in spite of these problems associated with the positive heat of mixing of the system of materials Cu—Co, it is possible to employ rapid solidification from the melt to set a Co supersaturation which is the precondition for a relatively high magnetoresistance of the end product. The advantages associated with the process according to the present invention should, in particular, be seen from the fact that it is possible to obtain in a relatively simple manner, by means of the rapid-solidification technique, preferably strip-shaped end products which are self-supporting and ductile and, especially for sensor applications, can readily be wound into coils or into other shapes.

The process according to the present invention is not limited only to the binary system of materials Cu—Co. On the contrary it is possible, in order to form the intermediate, advantageously to admix to the Cu—Co system of materials a component X of at least one element in such an amount, that the X proportion in the system of materials Cu—Co—X is at most 10 atom %. In this context, the at least one element of the component X should be chosen from the group of the 3d elements (elements having a 3d electron configuration) such as iron (Fe), nickel (Ni) etc. having an atomic number from 21 to 30 (inclusive), or from the 3rd main group of the Periodic Table of the Elements such as boron (B), aluminum (Al), gallium (Ga), indium (In), thallium (Tl). The heat treatment should be carried out in such a way that the Co precipitations in the Cu matrix are bound at least partially as at least one compound Co—X. Thus, for example, an addition of Fe or B to the binary Cu—Co system of materials facilitates the production, especially shaping, of the intermediate compared to the binary system, without a significant impairment of the magnetoresistive effect being observed. The optimum heat treatment for generating the Co precipitations should, in this case, generally be carried out at a slightly lower temperature, compared to the binary system. Formation of intermetallic compounds of Fe or B with Cu does not occur in the process.

BRIEF DESCRIPTION OF THE DRAWINGS

Advantageous embodiments of the process according to the present invention will become clear from the following description in view of the attached drawings.

The present invention is explained in more detail below with reference to illustrative examples, reference also being made to the drawing.

DETAILED DESCRIPTION

Figure 1:
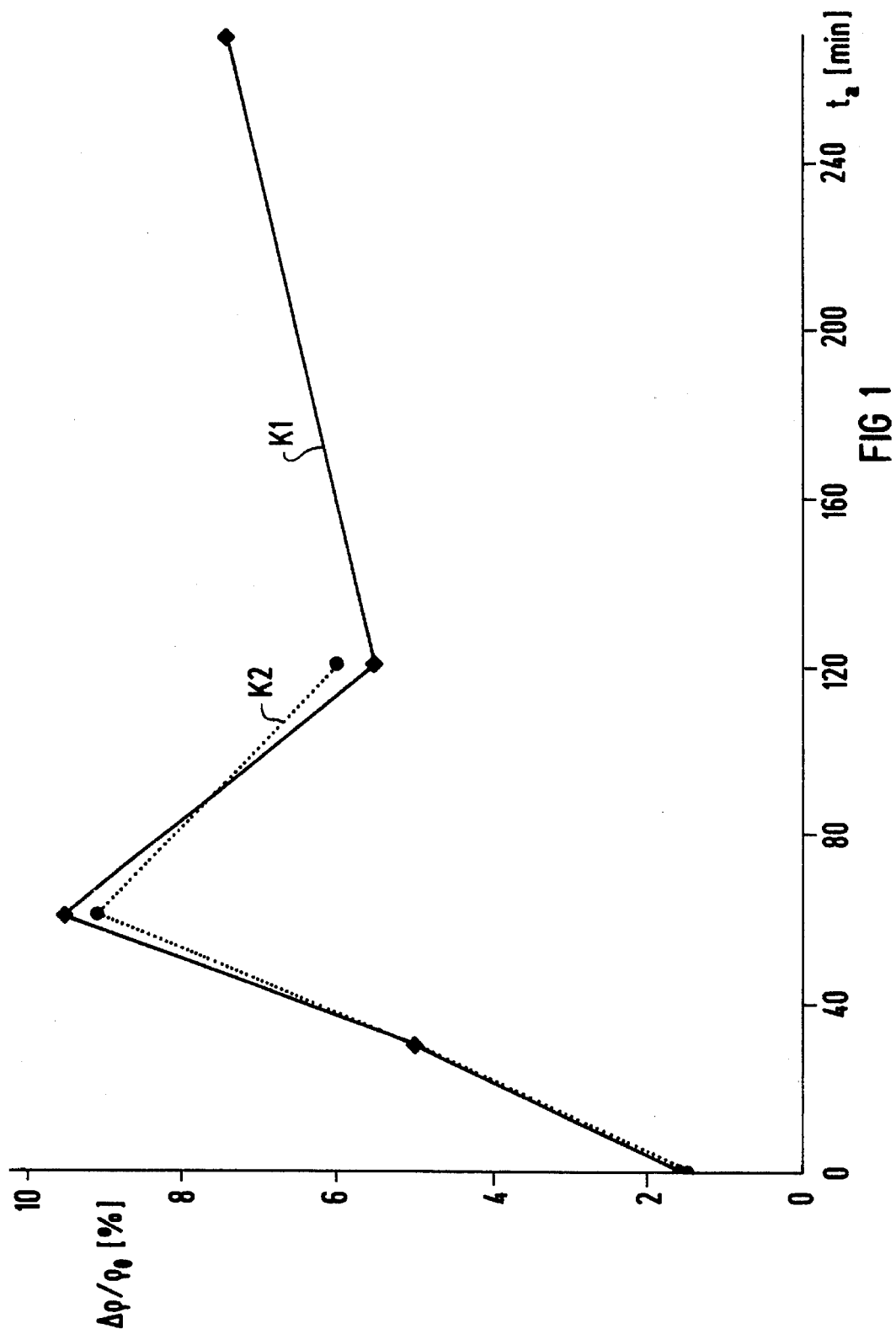
FIG. 1 and FIG. 2 each show in a diagram for the system of materials Cu—Co the change in resistance as a function of the aging time, and the electric resistance as a function of the magnetic field, respectively.

The process according to the present invention makes it possible to prepare a thin, generally elongated body such as, for example, a layer- or strip-shaped component which may preferably be self-supporting and is therefore particularly suitable for sensor applications. According to a first illustrative embodiment, the component should be selected from the binary system of materials Cu—Co. Its structure is therefore prepared, according to the present invention, from a $Cu_{1-x}Co_x$ alloy which comprises Cu mixed crystals supersaturated with Co. To this end, the following must hold good for the index x: $0.01<x<0.7$, preferably $0.02<x<0.6$, especially $0.05<x<0.25$. In general, the limits for the proportions of the two components should include values which deviate by up to ±5 atom % from the values specified. In addition, the specified composition may also contain small amounts of impurities of, in each case, below 0.2 atom % per impurity element.

An appropriate CuCo alloy is prepared according to a first process step of the process according to the present invention, a rapid-solidification technique being employed. To this end, the starting components of the material having sufficient purity are first melted under a purified Ar atmosphere to form a pre-alloy, the starting material being, e.g., a compacted powder mixture of the components. The proportions of the individual components in this process are chosen in such a way that the pre-alloy has at least approximately the composition of the desired material. The melting can be carried out using, in particular, pyrolytic BN or $Al_2O_3$ crucibles. Alternatively, melting can be carried out in an arc furnace. The pre-alloy thus obtained from the starting components is then converted into a finely crystalline intermediate by means of a rapid-solidification technique known per se. Possible rapid-solidification techniques include, for example, special sputtering or spraying techniques to form thin layers on suitable substrates or a preparation of metal powders by special atomization techniques. A particularly suitable method is formed by so-called "melt spinning", a rapid-solidification method which is generally known for the preparation of, in particular, amorphous metal alloys (cf. e.g. "Zeitschrift für Metallkunde", Volume 69, part 4, 1978, pp. 212 to 220 or "Physikalische Blätter", Vol. 34, 1978, pp. 573 to 584). Accordingly, the pre-alloy is melted in a protective atmosphere such as, e.g., Ar or in vacuum in, e.g., a quartz or BN crucible, using radio frequency, to a temperature from 1300° to 1600° C., especially from 1450° C. to 1550° C. In order to quench the melt, it is then sprayed through a nozzle having a nozzle diameter of, for example 0.5 mm and at an extrusion pressure of, e.g., 0.25 bar onto the rim, which is 5 cm wide for example, of a suitable rotating body, preferably a copper wheel. In the process, the wheel should rotate at such a speed that the required supersaturated Cu mixed crystals are obtained, i.e. the process is carried out in a solubility range of Co in Cu which is extended compared to the thermodynamic equilibrium. Said metastable solubility extension is recognized, e.g., by a characteristic shift of the Bragg reflections of Cu in X-ray diffraction experiments. To achieve this solubility extension, it is necessary to ensure relatively high surface velocities $v_s$ on the wheel perimeter. In general, velocities $v_s$ from 10 m/s to 80 m/s, especially from 40 m/s to 60 m/s are required. Strip-shaped pieces of the intermediate are then obtained which are relatively ductile. In this process, the degree of supersaturation depends, in particular, on the speed of the wheel, the extrusion pressure and the temperature of the melt.

Setting the precipitation morphology desired according to the present invention requires a subsequent heat treatment of the intermediate. To this end, temperatures $T_a$ from 100° to 1000° C., or for the selected binary system of materials preferably from 300° to 600° C., may advantageously be provided. The times $t_a$ for said heat treatment, the so-called aging times, are correlated with the temperature $T_a$ and in general are between 1 minute and from 4 to 10 hours, preferably from 20 to 120 minutes for the selected binary system of materials.

The diagram of FIG. 1 illustrates the change in resistance based on the relative change $\Delta\rho/\rho_0$ (in %) of the resistivity for two different rapidly solidified CuCo strips as a function of the aging time $t_a$ (in minutes). In this context, $\rho_0$ is the resistivity without an external magnetic field, while the following relationship holds good for $\Delta\rho$: $\Delta\rho=(\rho(B)-\rho_0)$: $\rho_0.\rho(B)$ is the resistivity in a magnetic field having induction B. The continuous curve K1 is found for a $Cu_{90}Co_{10}$ alloy, while a $Cu_{80}Co_{20}$ alloy produces the dotted curve K2. These alloys were each melted at 1500° C., quenched on a rotating Cu wheel having a surface velocity $v_s$ of 60 m/s and aged over various times $t_a$ at a temperature $T_a$ of 500° C. As can be seen from the diagram, the largest effect results after an aging time $t_a$ of approximately 60 minutes, this being largely independent of the composition of the alloy.

Figure 2:
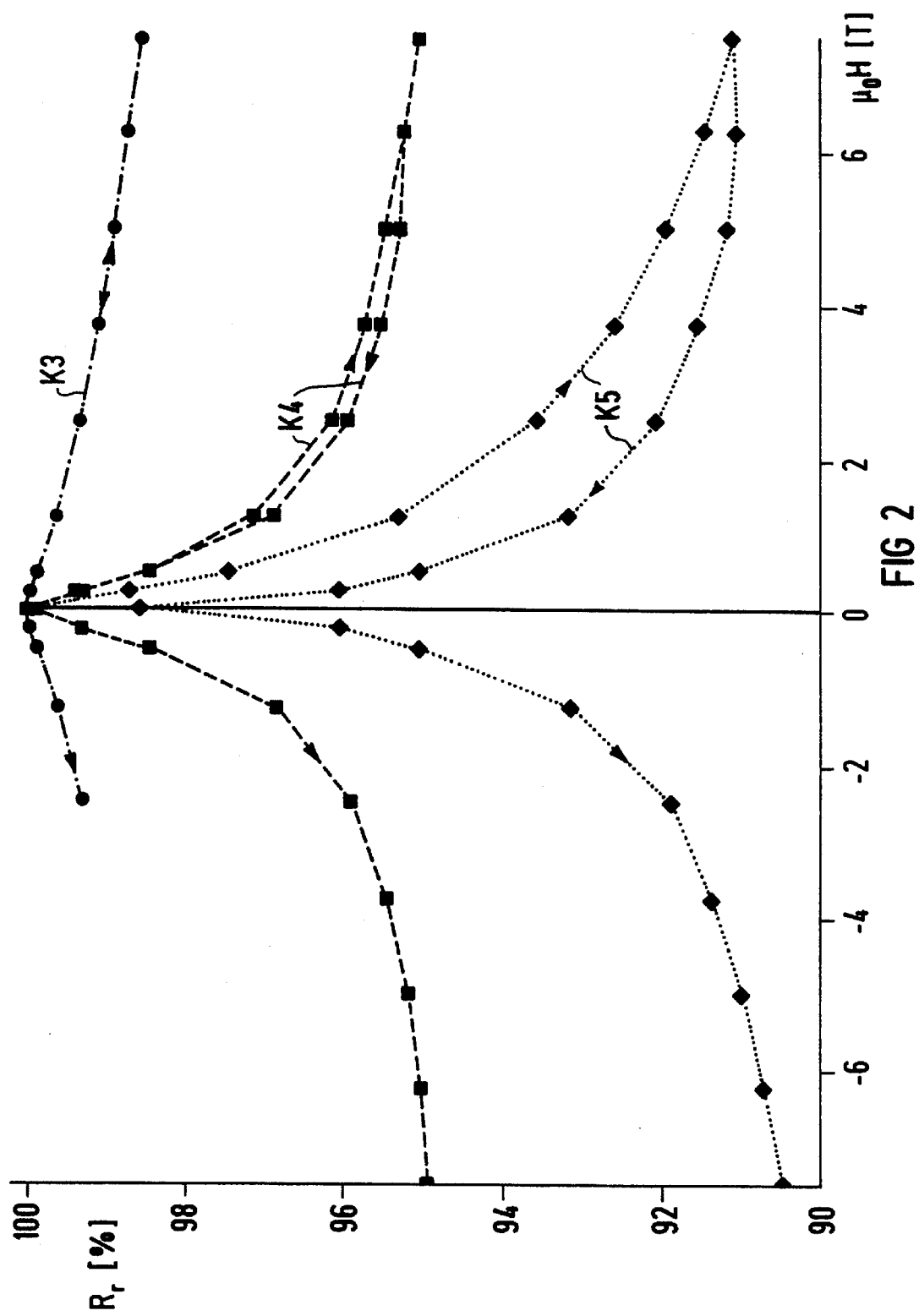

The influence of the aging time $t_a$ can also be seen from the diagram of FIG. 2. In this diagram, the relative electrical resistance $R_r$ (in %) as a function of an external magnetic field having the flux density $\mu_0* H$ (in T) for various rapidly solidified and heat-treated $Cu_{90}Co_{10}$ alloys is shown. The relative electrical resistance $R_r$ in this case is defined as the quotient of the ohmic resistance R(H) and R(B), measured at an external magnetic field having field strength H or induction B, respectively, and the resistance R(O) produced in the absence of a field. The so-called alloys were likewise melted at 1500° C. and sprayed onto a rotating Cu wheel with $v_s=60$ m/s. The course of the curves drawn as dot-and-dash lines and designated with K3 is obtained if the thermal secondary treatment according to the present invention for precipitating the Co in the rapidly solidified material is omitted. This is therefore based on the intermediate. The dashed curves K4 are obtained after 30-minute aging of this material at $T_a=500°$ C. 60-minute aging at this temperature $T_a$ produces a course of the curves K5 shown as dotted lines.

The arrows drawn at the individual measured curves in each case indicate the sense of direction of the respective measurement at approximately 300K (toward larger or smaller field strengths). Looking at all the curves together, it can be seen that in the quenched state without aging treatment a resistance change of only approximately 1% is obtained, while the resistance change by means of 60-minute aging increases to over 9%. Therefore, it is only the aging treatment which produces the desired high values of the magnetoresistance.

Figure 3:
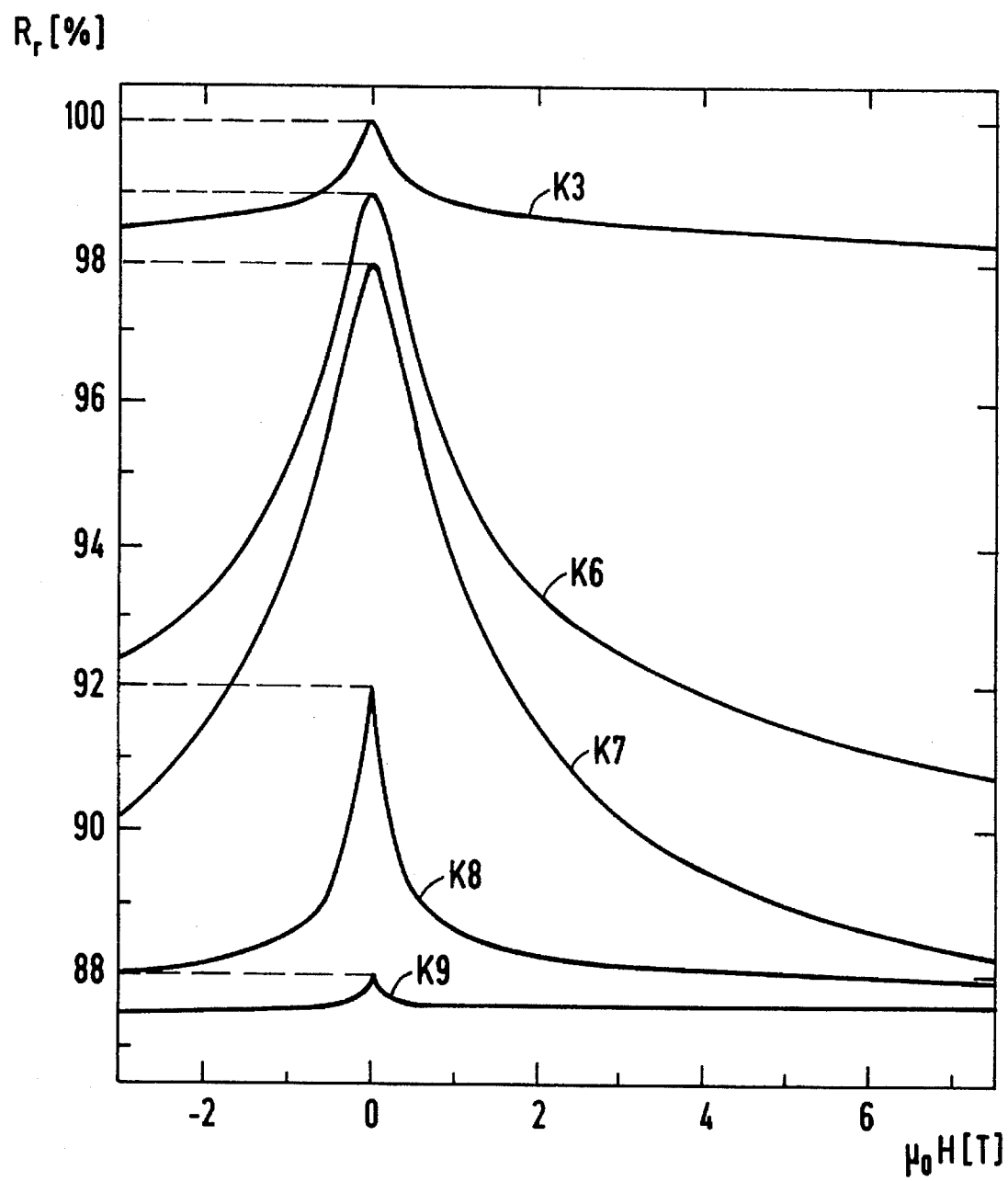
FIG. 3 reproduces the influence of the aging temperature for this system of materials.

The diagram of FIG. 3, in a depiction corresponding to FIG. 2, represents the influence of the aging temperatures $T_a$ for a $Cu_{90}Co_{10}$ alloy on which this figure is again based. This alloy was prepared in accordance with the explanations relating to FIG. 2. The material, which did not undergo thermal secondary treatment, produces a curve shape which again is designated with K3. The curves designated with K6, K7, K8, K9 are obtained for an aging temperature $T_a$ of 400° C. (curve K6), of 450° C. (curve K7), of 500° C. (curve K8), and of 600° C. (curve K9), respectively. From the various curve shapes it can be seen that aging temperatures $T_a$ from approximately 400° C. to 500° C. result in particularly high effects.

In the case of the above illustrative examples on which FIG. 1 to FIG. 3 are based, alloys from the binary system of materials Cu—Co were adopted. The process according to the present invention and the use of a structure prepared by means of this process in a magnetoresistive sensor are, however, not limited to a system of materials having only, at least essentially, two components. It has been found, namely, that the binary system of materials Cu—Co can be alloyed to a small extent with individual further elements, without the magnetoresistive properties, especially the magnetoresistive effect $M_r$, being significantly impaired. In some cases this may even be associated with a still further enhancement of the magnetoresistive effect. Concrete further elements are, especially, iron (Fe) and boron (B). A component to be produced involving one of these elements should therefore have a structure comprising a CuCoFe or CuCoB alloy of the exact or approximate composition $Cu_xCo_yX_z$, which has Cu mixed crystals supersaturated with Co. To this end, the following must hold good for the index y (in atom% in each case): $1<y<70$, preferably $2 \leq y \leq 60$, especially $5 \leq y \leq 20$. The following should hold good for the proportion z (in atom % in each case) of the Fe or B added to the binary system of materials Cu—Co as the component X: $0<z \leq 10$, preferably $1 \leq z \leq 5$. Co-supersaturation in this context is to be understood as the relatively high solubility in thermodynamic equilibrium at high temperatures being frozen, as it were, at low temperatures (room temperature) by conducting the preparation process in a special manner. At about 1110° C., the maximum solubility of Co in Cu is, namely, approximately 5.6 atom %. In contrast, the solubility at comparatively low temperatures in thermodynamic equilibrium is significantly lower (below 1% for temperatures below 400° C.). Beyond this, the specified composition may also comprise very small amounts of impurities of, in each case, below 0.2 atom % per impurity element. The remainder of the alloy, up to 1.00 atom %, at least essentially comprises the Cu serving as a matrix.

To provide a concrete illustrative embodiment, the following describes in more detail a process for preparing a corresponding CuCoB alloy, for example having the composition $Cu_{80}Co_{17}B_3$. The preparation process is based on the process explained previously with respect to the binary system of materials Cu—Co. Accordingly, a preallloy made from the now at least three starting components is used to produce, by means of a rapid-solidification technique known per se such as, for example, the melt spinning process, a finely crystalline intermediate. To this end, the preallloy is melted at a temperature from 1300° to 1600° C. and is then sprayed onto a rotating body which has a relatively high surface velocity $v_s$ at its wheel perimeter. The velocity $v_s$ in this case is from 10 m/s to 80 m/s. Strip-shaped pieces of the intermediate are thus obtained which are relatively ductile.

In a second step, the desired precipitation morphology is then set in the intermediate by means of a heat treatment. The temperature $T_a$ required therefor and the aging time $t_a$ employed in the process should be chosen in such a way that, on the one hand, the required precipitations on the basis of Co are produced, the Co being bound wholly or only partially to the B in the form of borides, e.g. as CoB and/or $Co_2B$ and/or $Co_3B$. In particular, the stoichiometry of the intermediate and the heat treatment are adjusted in such a way that not all the Co, preferably less than 50% of the Co, is bound as boride. To this end, temperatures $T_a$ from 100° to 700° C., preferably from 200° to 500° C., can advantageously be provided. The times $t_a$ for the heat treatment or aging are correlated with the temperature $T_a$ and in general are from 5 minutes to 4 hours, preferably from 45 minutes to 90 minutes. The aging times are found to be largely independent of the respective composition of the chosen alloy.

Figure 4:
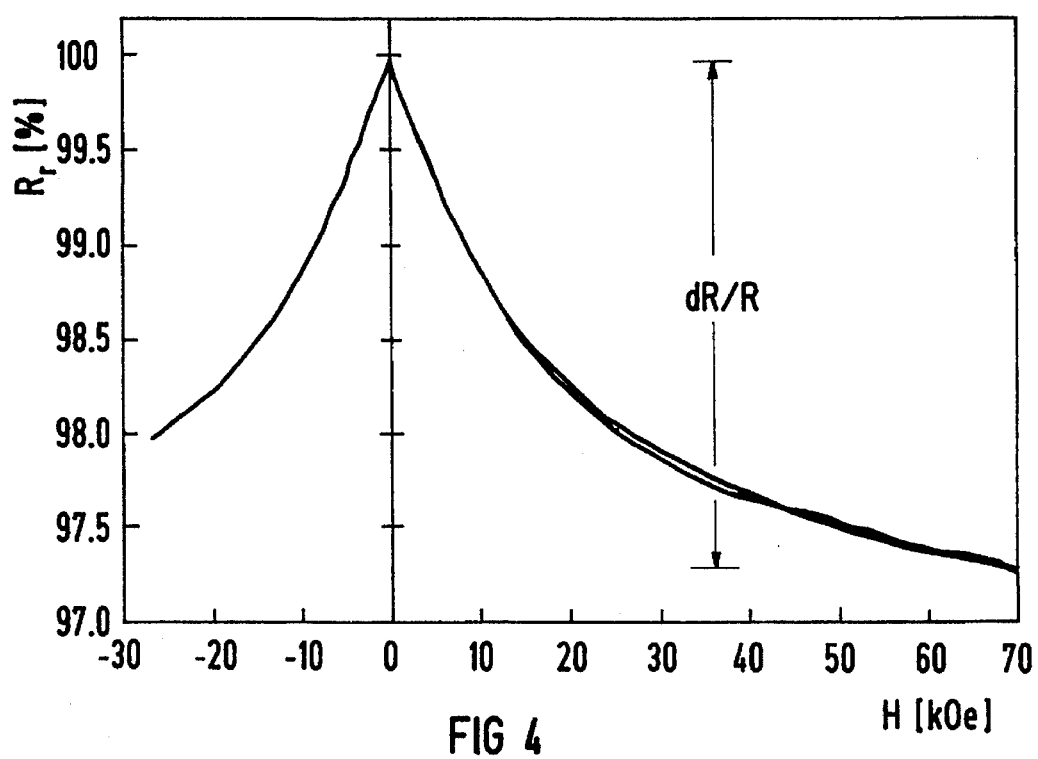
FIG. 4 and FIG. 5 each depict in a diagram for the system of materials Cu—Co—B and Cu—Co—Fe, respectively, the electric resistance as a function of the magnetic field.

The curve reproduced in the diagram of FIG. 4 illustrates the magnetic-field dependence of the relative electrical resistance of a three-component alloy strip prepared according to the present invention in accordance with the process steps described above. The variables plotted in the diagram are, along the abscissa, the applied (external) magnetic field having strength H (in kOe, where $1 \text{ Oe}=10^3/4\pi\text{A/m}$) and, along the ordinate, the relative electrical resistance $R_r$ as the dependent variable. The illustrative embodiment is based on a rapidly solidified and heat-treated $Cu_{90}CO_9B_1$ alloy. To this end, a corresponding powder mixture of this alloy is melted at 1500° C. and sprayed onto a rotating Cu wheel at $v_s=60$ m/s. The curve shape shown is obtained after aging the alloy strip thus produced for 60 minutes at a temperature $T_a=500°$ C. Based on the curve shape, maximum relative resistance difference $dR/R=(R(O)-R(H))/(R(O)$ of approximately 2.6% can be read off which corresponds to the magnitude of the magnetoresistive effect $M_r$ of the structure prepared according to the present invention.

If, for comparative purposes, the aging treatment of an alloy strip having a corresponding composition is omitted, the maximum relative resistance difference is only about 1%.

If further illustrative examples involving a B component are based on magnetoresistance alloys having the ternary composition $Cu_{97}Co_2B_1$ or $Cu_{39}Co_{60}B_1$ or $Cu_{93}Co_2B_5$ or $Cu_{35}Co_{60}B_5$, similar situations as for the previously described $Cu_{90}Co_9B_1$ alloy are observed.

In the case of the three-component illustrative embodiments specifically described above, the ternary component X of the system of materials Cu—Co—X was the element B. An alternative choice for the component X is the element Fe, in order to obtain a structure according to the present invention having an enhanced magnetoresistive effect $M_r$ in the same order of magnitude as the system of materials Cu—Co—B. The proportions of the individual components in the system of materials Cu—Co—Fe in this case correspond to those of the system Cu—Co—B. Examples for corresponding alloys are $Cu_{97}Co_2Fe_1$, $Cu_{39}Co_{60}Fe_1$, $Cu_{93}Co_2Fe_5$ or $Cu_{35}Co_{60}Fe^5$.

Figure 5:
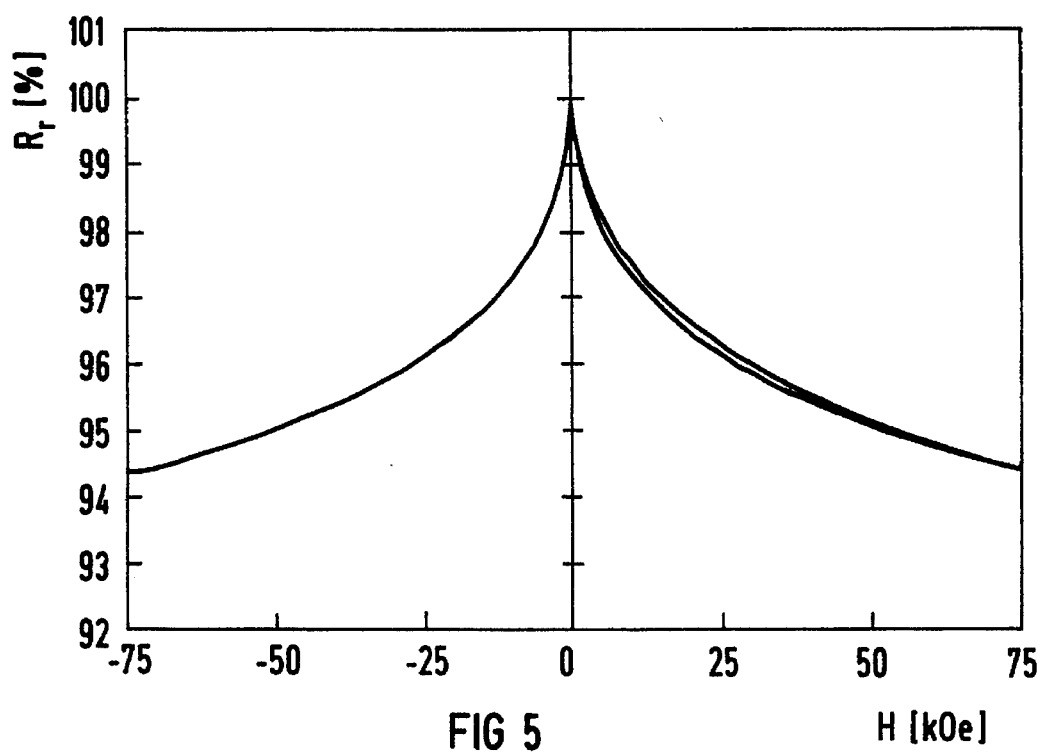

FIG. 5 is a diagram illustrating a measured curve found for a $Cu_{90}Co_8Fe_2$ alloy. The representation chosen for the diagram corresponds to FIG. 3. The $Cu_{90}Co_8Fe_2$ alloy was prepared according to the present invention in analogy to the alloy having the B component on which FIG. 4 was based. The maximum relative resistance difference, or the magnetoresistive effect $M_r$, in this case is approximately 5.5%.

Of course it is also possible to provide for the structure to be prepared according to the present invention and having an enhanced magnetoresistance, a component X which, in addition to the element Fe, comprises a comparatively minor fraction, preferably less than 35 atom % in terms of component X, of the element B. An appropriate example would be $Cu_{70}Co_{20}Fe_8B^2$.

What is claimed is:

1. A process for preparing a Cu—Co granular structure having enhanced magnetoresistance, comprising steps of:

initially forming a melt containing Cu and Co components having very small mutual solubility, and then forming an intermediate of the structure by means of a rapid-solidification technique on said initially formed melt, said intermediate containing an alloy having Cu mixed crystals supersaturated with Co; and converting of the formed intermediate by means of a heat treatment into an end product of the granular structure having enhanced magnetoresistance, the end product of the granular structure having precipitates of or including Co in a Cu matrix.

2. The process as claimed in claim 1, wherein the rapid-solidification technique is a melt spinning process.

3. The process as claimed in claim 2, wherein the melt spinning process includes a step of melting components of the alloy at a temperature from 1300° C., to 1700° C.

4. The process as claimed in claim 3, wherein the melt spinning process further includes, to achieve rapid solidification, a step of spraying the melted alloy components onto a rotating body whose circumferential velocity $v_s$ is at least 10 m/s and at most 80 m/s.

5. The process as claimed in claim 4, wherein the circumferential velocity $v_s$ is at least 40 m/s.

6. The process as claimed in claim 2, wherein the melt spinning process includes a step of melting components of the alloy at a temperature from 1450° C. to 1550° C.

7. The process as claimed in claim 2, wherein the melt spinning process includes steps of melting components of the alloy and, to achieve rapid solidification, spraying the melted alloy components onto a rotating body whose circumferential velocity $v_s$ is at least 10 m/s and at most 80 m/s.

8. The process as claimed in claim 2, wherein the melt spinning process further includes steps of melting components of the alloy, and to achieve rapid solidification, spraying the melted alloy components onto a rotating body whose circumferential velocity $v_s$ is at least 40 m/s and at most 60 m/s.

9. The process as claimed in claim 2, wherein the heat treatment of the intermediate is carried out at an aging temperature $T_a$ from 100° C. to 1000° C.

10. The process as claimed in claim 1, wherein the heat treatment of the intermediate is carried out at an aging temperature $T_a$ from 100° C. to 1000° C.

11. The process as claimed in claim 1, wherein the heat treatment of the intermediate is carried out at an aging temperature $T_a$ from 200° C. to 600° C.

12. The process as claimed in claim 1, wherein the heat treatment of the intermediate is carried out over an aging time $t_a$ from 1 minute to 4 hours.

13. The process as claimed in claim 1, wherein the heat treatment of the intermediate is carried out over an aging time $t_a$ from 10 minutes to 90 minutes.

14. The process as claimed in claim 1, wherein a composition of a $Cu_{1-x}Co_x$ alloy is produced, and wherein: $0.01 < x < 0.7$.

15. The process as claimed in claim 1, wherein a composition of a $Cu_{1-x}Co_x$ alloy is produced, and wherein: $0.05 \leq x \leq 0.25$.

16. The process as claimed in claim 1, wherein:

said forming of the intermediate comprises admixing a Cu—Co composition with a component X to form a Cu—Co—X system containing component X in an amount of at most 10 atom %, the component X being chosen from the group of elements having an atomic number from 21 to 30 inclusive, or from the group consisting of boron, aluminum, gallium, indium, and thallium; and carrying out the heat treatment in such a way that at least a portion of the Co precipitates in the Cu matrix form at least one compound Co—X.

17. The process as claimed in claim 16, comprising carrying out the heat treatment in such a way that less than 50% of the Co precipitates form a compound Co—X.

18. The process as claimed in claim 16, wherein a composition of the $Cu_xCo_yX_z$ alloy is produced wherein y and z (each in atom %) are defined as: $1<y<70$, and $0<z\leq 10$.

19. The process as claimed in claim 16, wherein a composition of the $Cu_xCo_yX_z$ alloy is produced wherein y and z (each in atom %) are defined as: $2\leq y\leq 60$, and $1\leq z\leq 5$.

20. The process as claimed in claim 17, wherein a composition of the $Cu_xCo_yX_z$ alloy is produced wherein y and z (each in atom %) are defined as: $1<y<70$, and $0<z\leq 10$.

* * * * *